(12) United States Patent
Leydier et al.

(10) Patent No.: US 6,217,685 B1
(45) Date of Patent: Apr. 17, 2001

(54) METHOD FOR INSERTING AN ELECTRONIC MODULE IN A CARD BODY WITH ELECTRONIC MEMORY

(75) Inventors: Robert Leydier, Orsay; Bertrand D'Arbonneau, Paris, both of (FR)

(73) Assignee: Schlumberger Systemes, Paris (FR)

( * ) Notice: Subject to any disclaimer, the term of this patent is extended or adjusted under 35 U.S.C. 154(b) by 0 days.

(21) Appl. No.: 09/202,269

(22) PCT Filed: Apr. 2, 1998

(86) PCT No.: PCT/FR98/00671

§ 371 Date: Mar. 22, 1999

§ 102(e) Date: Mar. 22, 1999

(87) PCT Pub. No.: WO98/45805

PCT Pub. Date: Oct. 15, 1998

(30) Foreign Application Priority Data

Apr. 10, 1997 (FR) .................................................. 97 04430

(51) Int. Cl.⁷ ...................................................... B32B 31/16
(52) U.S. Cl. ........................... 156/73.1; 156/242; 156/292
(58) Field of Search .................................. 156/73.1, 292, 156/580.1, 580.2, 242; 264/442, 443, 445

(56) References Cited

U.S. PATENT DOCUMENTS

| | | | |
|---|---|---|---|
| 4,990,759 | * | 2/1991 | Gloton et al. ........................ 235/492 |
| 5,057,679 | * | 10/1991 | Audic et al. ......................... 235/492 |
| 5,350,713 | * | 9/1994 | Liang .................................. 437/217 |
| 5,540,808 | * | 7/1996 | Vincent et al. ..................... 156/580.2 |
| 5,581,445 | | 12/1996 | Horejs, Jr. et al. .................. 361/737 |
| 5,673,179 | * | 9/1997 | Horejs, Jr. et al. .................. 361/737 |
| 5,682,293 | * | 10/1997 | Horejs, Jr. et al. .................. 361/737 |
| 5,682,294 | * | 10/1997 | Horejs, Jr. et al. .................. 361/737 |
| 5,682,295 | * | 10/1997 | Horejs, Jr. et al. .................. 361/737 |
| 5,682,296 | * | 10/1997 | Horejs, Jr. et al. .................. 361/737 |
| 5,833,785 | * | 11/1998 | Centofante ............................. 156/69 |

FOREIGN PATENT DOCUMENTS 0 322 320   6/1989   (EP) .
0 334 733   9/1989   (EP) .

* cited by examiner

*Primary Examiner*—James Sells
(74) *Attorney, Agent, or Firm*—Frishauf, Holtz, Goodman, Langer & Chick, P.C.

(57) ABSTRACT

The invention concerns a method for inserting an electronic module (13) on a thermoplastic substrate (131) in a cavity (12) provided in a card with electronic memory in thermoplastic material. The invention is characterized in that it consists in the following steps: a) depositing in said cavity (12) an adhesive (14) for gluing the electronic module (13) thermoplastic substrate (131) on the card body (11) thermoplastic material; b) arranging the electronic module (13) in the cavity (12); c) simultaneously applying a pressing force (F) on the electronic module (13) and ultrasonic energy (US) on the cavity (12) thermoplastic material, in contact with the electronic module (13) thermoplastic substrate (131). The invention is useful for making cards with electronic memory.

8 Claims, 2 Drawing Sheets

METHOD FOR INSERTING AN ELECTRONIC MODULE IN A CARD BODY WITH ELECTRONIC MEMORY

The present invention concerns a method for inserting an electronic module into an electronic smart card body.

The invention can be particularly advantageous in the field of producing electronic smart cards in which an electronic module is inserted inside a moulded or machined cavity in a card body.

A known technique for producing electronic smart cards firstly consists of producing an electronic module formed of a semi-conductive pellet disposed on a first face of a nonconducting substrate made for example of a thermoplastic material, said semi-conductive pellet being connected to electric contacts placed on a second face of the substrate by conductive wires traversing holes made in said substrate.

Then the electronic module obtained as above is inserted in a cavity fitted in the card body. In the case where said card body is extracted from a laminated thermoplastic sheet, the cavity is embodied by means of machining in the thickness of said sheet. When the card body is moulded, the cavity is obtained directly by giving a suitable shape to the impression of the mould.

So as to fix the electronic module in the card body, several drops of adhesive, such as cyanoacrylate drops, can be placed in the cavity, said module then being inserted in said cavity, and finally by pressing on the electronic module.

The forced placing in contact of the module and card make it possible to obtain a thin and homogeneous adhesive film. However, the residual deformations of the electronic module, which is cut off for example from a continuous strip by means of a matrix punch device, and the cavity embodied by moulding are opposite each other once the pressing forced is released when the assembly becomes immobile, an essential condition for obtaining the full effectiveness of the adhesive.

The polymerisation time, at the end of which the mechanical performances exceed 80% of those obtained with an extremely long pressing time, is close to 60 seconds.

Generally speaking, the hourly production capacity of the method reduces when the pressing time increases.

This is why the selected pressing time needs to achieve a compromise between the mechanical performances of the adhesive joint and the hourly production capacity. It must not be too short to avoid adversely affecting the quality of gluing, but it must not be too long so as to provide a sufficient production rate.

However, this compromise solution is not satisfactory as a change of materials, a variation of the surface conditions and atmospheric conditions modify the reaction of the adhesive and can result in the beginnings of let-go, especially when it is known that humidity favours the start of polymerisation. As a result, the statistical follow up of the known insertion method is impossible and large quantities of cards need to be tested so as to guarantee gluing.

Also, the technical problem to be resolved by the object of the present invention concerns a method for inserting an electronic module on a thermoplastic substrate in a cavity fitted in an electronic smart card body made of a thermoplastic material, a method which would embody an equivalent indefinite pressing time whilst reducing the insertion time to several hundreds milliseconds and by optimising the mechanical performances of the adhesive.

According to the present invention, the solution to the technical problem referred to above is obtained by virtue of the fact that said method comprises stages consisting of:

a) placing in said cavity an adhesive for gluing the thermoplastic substrate of the electronic module onto the thermoplastic material of the card body,
b) placing the electronic module in the cavity,
c) simultaneously applying a pressing force on the electronic module and an ultrasonic energy to the thermoplastic material of the cavity in contact with the thermoplastic substrate of the electronic module.

Thus, the ultrasonic energy definitively welds the thermoplastic substrate of the module in the cavity, this having the effect of maintaining the pressing force indefinitely and thus making it possible to obtain polymerisation in ideal conditions resulting in optimal mechanical performances of the adhesive joint. On the other hand, the immobilisation of the card at the pressing/welding station with ultrasounds can be limited to solely the time required to embody the weld which, having regard to the small quantities of material involved, is extremely short, namely about several tenths of a second. Full polymerisation of the adhesive under pressure, which may reach periods approaching 60 seconds, is effected in masked time during the next stages for producing the card.

Thus, it can be seen that by reducing the period of the insertion operation, the method of the invention is able to attain the full mechanical performances of the adhesive without fundamentally compromising the existing material and with the advantage of reducing the rate of conformity test samplings.

According to one embodiment of the method of the invention, prior to stage a), ultrasonic energy concentrators are provided in said cavity for coming into contact with the thermoplastic substrate of the electronic module. The purpose of the energy concentrators is to reduce the ultrasonic energy level required for welding of the module in the cavity to a value of less than 100 millijoules. Because of this, the surface condition at the back of the card does not deteriorate.

According to the card production mode, the ultrasonic energy concentrators are embodied by moulding with the card body or by machining with the cavity. In one variant, said concentrators shall be on the electronic module.

The following description, given with reference to the accompanying drawings given by way of non-restrictive examples, shall more clearly make it possible to understand the contents of the invention and on how the latter can be embodied.

FIG. 3 is a top view of a variant of FIG. 1a.

FIG. 1 shows a partial cutaway view of a body 11 of an electronic smart card embodied in a thermoplastic material, such as PVC, ABS (acrylonitryl-butadiene-styrene), polyester or polycarbonate. Said card body 11 can be obtained by lamination or moulding.

Figure 1:
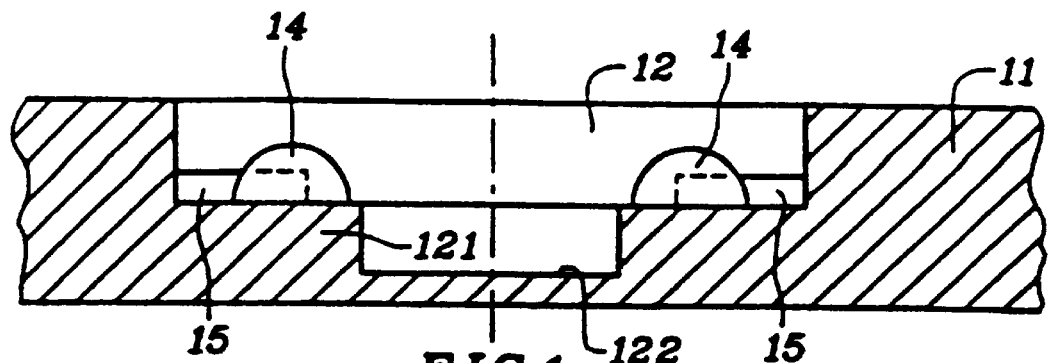
FIG. 1 is a partial cutaway view of a card body prior to the insertion of the electronic module.

On FIG. 1, the card body 11 comprises a cavity 12 for receiving an electronic module 13 which, as shown diagrammatically on the figure, is formed of a nonconducting substrate 131 made of a thermoplastic material, such as polycarbonate, carrying on one face a semi-conductive pellet 132 connected by conductive wires (not shown) to electric contacts 133 laid on another face of the thermoplastic substrate 131. Having regard to the particular shape of the module 13, the cavity 12 has a shoulder 121 for receiving the non-conducting substrate 131 and a housing 122 for the semiconductive pellet 132.

The embodiment of the cavity 12 depends on the card body production mode, namely machining or moulding.

The method to insert the electronic module 13 in the cavity 12 consists in a first stage of placing in the cavity 12 an adhesive so as to glue the thermoplastic substrate 131 of the module 13 onto the thermoplastic material of the card body 11. According to the example shown on FIGS. 1 and 1*a*, it is possible to deposit four drops 14 of a cyanoacrylate glue on the shoulder 121 at the four corners of the cavity 12.

Then the electronic module 13 is placed in the cavity 12 so that the substrate 131 comes into contact with the glue drops 14 of the shoulder 121.

Figure 1A:
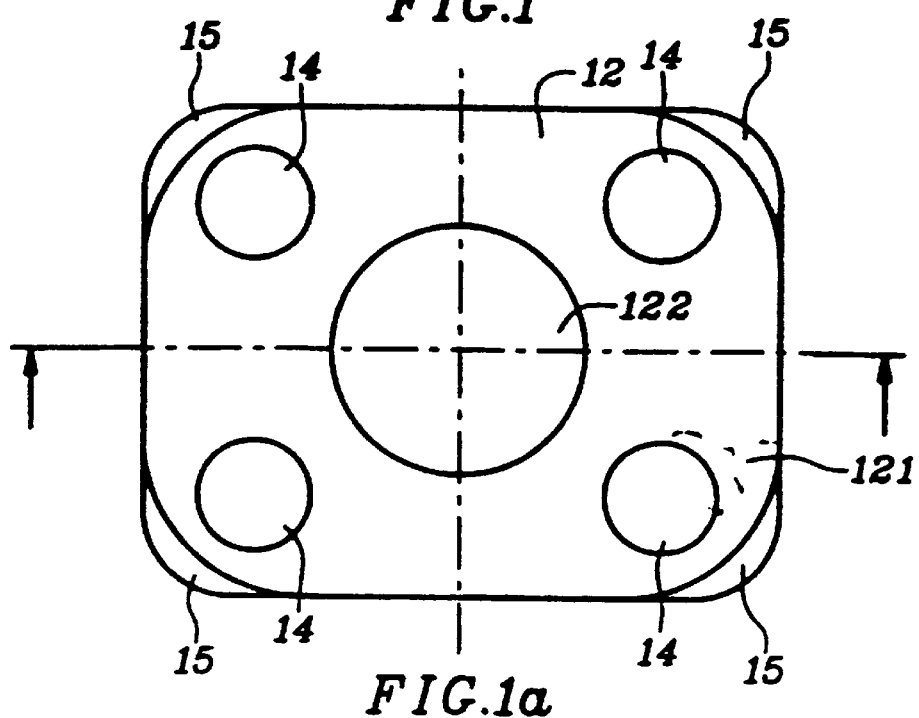
FIG. 1a is a top view of the body of the card of FIG. 1.

Finally, a pressing force F is firstly applied to the module so as to bring the drops 14 to form a glue joint between the shoulder 121 of the cavity 12 and the thermoplastic substrate 131, and secondly to place said substrate 13 in support on ultrasonic energy concentrators 15, one possible disposition of the latter being shown on FIG. 1*a*. At the same time, an ultrasonic energy US is applied to the electronic module 13 so as to weld the concentrators 15 to the thermoplastic substrate 131.

With the electronic module 13 supported this way, the pressing force F can be released. In other words, the pressing time is reduced to the time required to apply the ultrasonic energy to embody the concentrators 15/substrate 131 weld, namely several tenths of a second. This results in having greater production capacity and optimum gluing quality since polymerization of the glue can be made for an unlimited period in a force equivalent to the pressing force F.

Figure 2:
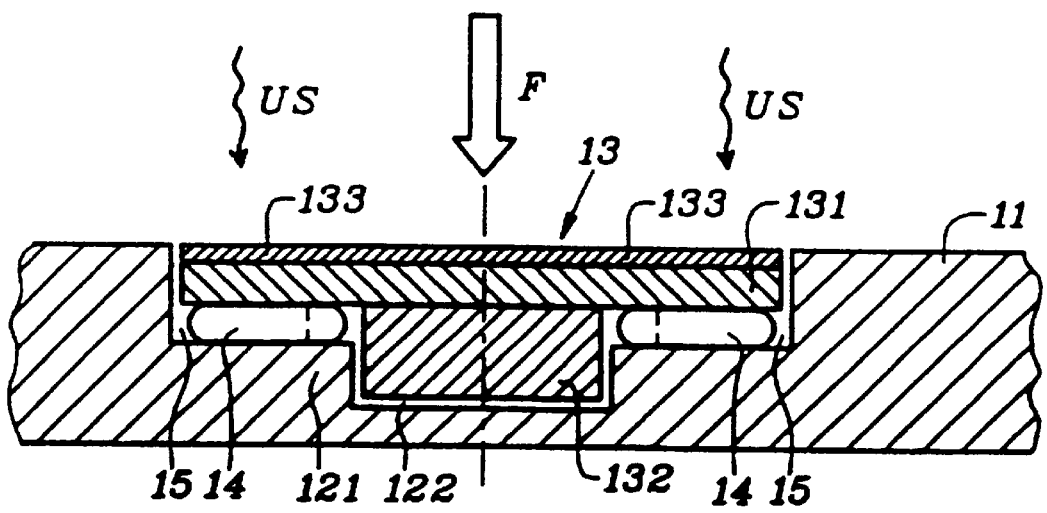
FIG. 2 is a partial cutaway view of the card body of FIG. 1 during insertion of the electronic module.
Figure 3:
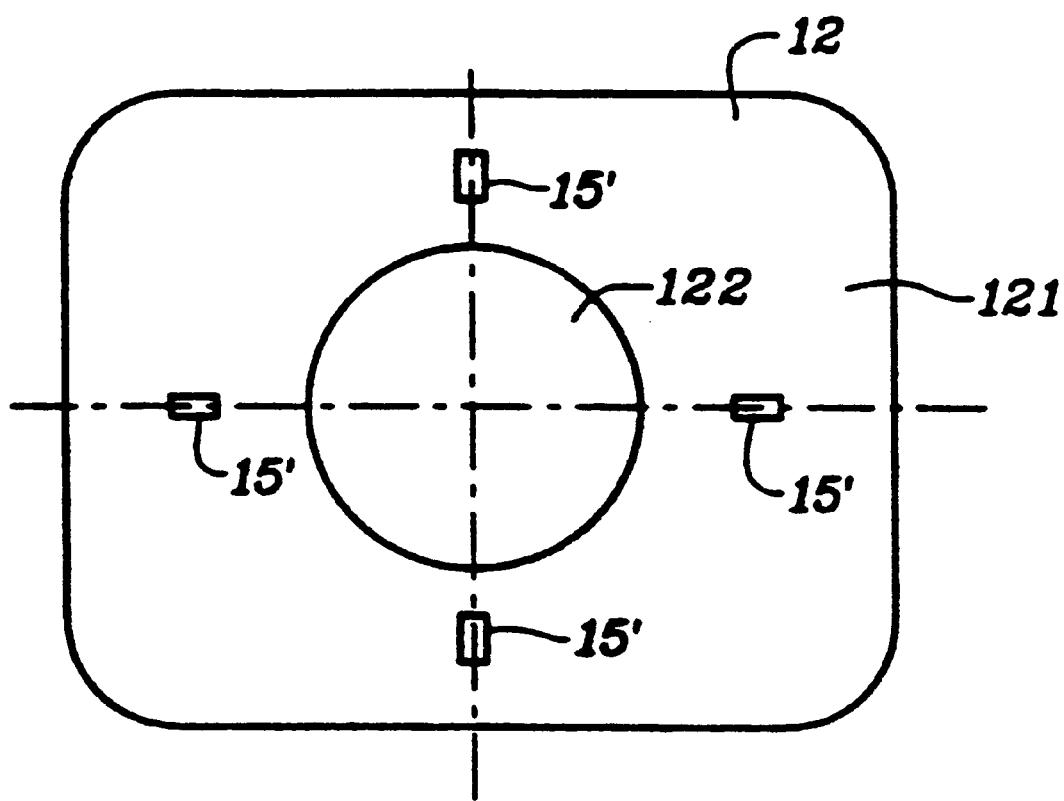

Of course, the ultrasonic energy concentrators may assume various shapes, like the protuberances 15' of FIG. 2, embodied by machining or moulding depending on the card body 11 production mode.

What is claimed is:

1. A method for fixing an electronic module to a body of an electronic smart card made of a thermoplastic material, the module having a semiconductor component supported on a thermoplastic substrate and fitted within a cavity in the card body, said method comprising:

depositing an adhesive in the cavity;

placing the electronic module in the cavity;

providing ultrasonic energy concentrators in said cavity and disposed on one of said card body and the electronic module, and facing the other; and applying both a pressing force and ultrasonic energy to press the electronic module and card body together, to create a weld between the concentrators and the substrate of the electronic module, and to compress the adhesive between the card body and the electronic module in order to enable creation of a glued joint therebetween.

2. The method of claim 1, wherein said pressing force is applied for a period of time sufficient to create the weld and shorter than a period of time required for occurrence of polymerization of said adhesive required for said glued joint to have a given level of mechanical strength.

3. The method of claim 1, wherein said concentrators are disposed on the card body.

4. The method of claim 1, wherein said concentrators are disposed on the electronic module.

5. The method of claim 1, wherein the concentrators are formed by molding.

6. The method of claim 1, wherein the concentrators are formed by machining.

7. The method of claim 1, wherein said substrate is made from a polycarbonate.

8. The method of claim 1, wherein the thermoplastic material of the card body is formed from the group consisting of PVC, ABS (acrylonitrite-butadiene-styrene), polyester and polycarbonate.

* * * * *